(12) United States Patent
Song (10) Patent No.: US 9,922,990 B2
(45) Date of Patent: Mar. 20, 2018

(54) THREE DIMENSIONAL FLASH MEMORY USING ELECTRODE LAYERS AND/OR INTERLAYER INSULATION LAYERS HAVING DIFFERENT PROPERTIES, AND PREPARATION METHOD THEREFOR

(71) Applicant: INDUSTRY-UNIVERSITY COOPERATION FOUNDATION HANYANG UNIVERSITY, Seoul (KR)

(72) Inventor: Yun Heub Song, Gyeonggi-do (KR)

(73) Assignee: INDUSTRY-UNIVERSITY COOPERATION FOUNDATION HANYANG UNIVERSITY, Seoul (KR)

( * ) Notice: Subject to any disclaimer, the term of this patent is extended or adjusted under 35 U.S.C. 154(b) by 0 days.

(21) Appl. No.: 15/115,232

(22) PCT Filed: Dec. 31, 2014

(86) PCT No.: PCT/KR2014/013095
§ 371 (c)(1),
(2) Date: Jul. 28, 2016

(87) PCT Pub. No.: WO2015/115739
PCT Pub. Date: Aug. 6, 2015

(65) Prior Publication Data
US 2016/0343728 A1    Nov. 24, 2016

(30) Foreign Application Priority Data

Jan. 28, 2014 (KR) .................. 10-2014-0010744
Sep. 16, 2014 (KR) .................. 10-2014-0122650

(51) Int. Cl.
*H01L 29/792* (2006.01)
*H01L 27/11582* (2017.01)
(Continued)

(52) U.S. Cl.
CPC .... *H01L 27/11582* (2013.01); *G11C 16/0483* (2013.01); *H01L 27/1157* (2013.01); *G11C 16/0466* (2013.01)

(58) Field of Classification Search
CPC ......... H01L 27/11582; H01L 27/11568; G11C 16/04
(Continued)

(56) References Cited

U.S. PATENT DOCUMENTS 8,916,926 B2 * 12/2014 Choe .................. H01L 27/1157
257/324
2010/0078701 A1 * 4/2010 Shim ................. H01L 27/11521
257/314

FOREIGN PATENT DOCUMENTS

JP    2011-066417 A    3/2011
KR   2010-0036520 A   4/2010
(Continued)

OTHER PUBLICATIONS

International Search Report for PCT/KR2014/013095, dated Mar. 23, 2015.
Written Opinion for PCT/KR2014/013095, dated Mar. 23, 2015.

*Primary Examiner* — David S Blum
(74) *Attorney, Agent, or Firm* — Marshall, Gerstein & Borun LLP (57) ABSTRACT

Embodiments of the present invention enable threshold voltage distribution of a plurality of electrode layers to be improved by configuring each of the plurality of electrode layer maintains to have different physical structures or materials, etc., thereby enhancing credibility during a process of maintaining stores data and a reading process.

12 Claims, 10 Drawing Sheets

(51) Int. Cl.
*H01L 27/1157* (2017.01)
*G11C 16/04* (2006.01)
(58) Field of Classification Search
USPC .......................................................... 257/324
See application file for complete search history.

(56) References Cited

FOREIGN PATENT DOCUMENTS

| KR | 2012-0121746 A | 11/2012 |
| KR | 2013-0127791 A | 11/2013 |

\* cited by examiner

| Structure Parameter |
|---|
| The number of Gate layer : 10/30/50 layer |
| Contact parameter |
| <Program operation><br>Select cell Gate : 10 V<br>Unselect cell Gate : Vpass [5 V]<br>SSL Gate : Vcc [3.3 V]<br>SSL Drain : 0 V<br>GSL Gate : 0 V<br>GSL Source : 0 V<br>< Read Operation ><br>Select cell Gate : -1~8 V [swip]<br>UnSelect cell Gate : Vpass [5 V]<br>SSL Gate : Vcc [3.3 V]<br>SSL Drain : 1 V<br>GSL Gate : Vcc [3.3 V]<br>GSL SOURCE : 0 V |

THREE DIMENSIONAL FLASH MEMORY USING ELECTRODE LAYERS AND/OR INTERLAYER INSULATION LAYERS HAVING DIFFERENT PROPERTIES, AND PREPARATION METHOD THEREFOR

TECHNICAL FIELD

Embodiments of the present invention relate to a three dimensional flash memory using electrode layers and/or interlayer insulation layers having different properties, and a preparation method thereof, and more particularly, relate to a three dimensional flash memory with an improved threshold voltage distribution of a plurality of electrode layers and a uniform stress level of a plurality of interlayer insulation layers by differentiating the plurality of electrode layers or the plurality of interlayer insulation layers in properties, and a preparation method thereof.

BACKGROUND ART

Flash memory devices are Electrically Erasable Programmable Read Only Memory (EEPROM). Flash memories may be widely employed, for example, in computers, digital cameras, MP3 players, game systems, memory sticks, and so on. The flash memory devices electrically control data to be input or output in the mechanism of Fowler-Nordheim (FN) tunneling effect or hot electron injection.

In view of electric circuit, the flash memory devices may be generally classified into a NAND type where N-numbered cell transistors are serially connected each other to form a unit string and a plurality of unit strings is connected in parallel between a bit line and a ground line, and a NOR type where cell transistors are serially connected between a bit line and a ground line.

Such a flash memory device must be designed to store a large capacity of data as much as possible. Therefore, a unit chip is required to include a multiplicity of cell transistors. However, there is a limit in highly raising integration density of cell transistors within a defined horizontal area.

A three dimensional memory structure may be helpful to overcome the two dimensional scaling limit of the NAND flash memory. Structures of three dimensional NAND flash memories may include Built-In Current Sensor (BICS) types and piped Bit Cost Scalable (BiCS) types which are advanced from the BIOS types.

DETAILED DESCRIPTION OF THE INVENTION

Technical Problem

Embodiments of the present invention provide a three dimensional flash memory with an improved threshold voltage distribution of a plurality of electrode layers by differentiating the plurality of electrode layers in physical structures or materials, and a preparation method thereof.

Embodiments of the present invention also provide a three dimensional flash memory with a uniform stress level of interlayer insulation layers by differentiating the interlayer insulation layers, as well as a plurality of electrode layers, in physical structures or materials.

TECHNICAL SOLUTION

A three dimensional flash memory according to an embodiment of the present invention may include: a channel layer; a plurality of electrode layers connected with the channel layer and stacked vertically; and a plurality of interlayer insulation layers connected with the channel layer, disposed alternately with the plurality of electrode layers, and stacked vertically, wherein the plurality of electrode layers may have different physical structures or different materials.

A first electrode layer of the plurality of electrode layers may be thicker than a second electrode layer, which is placed in an upper layer part of the first electrode layer, in a thickness.

Respective lengths or surface patterns of the plurality of electrode layers may be different each other.

A material forming a first electrode layer of the plurality of electrode layers may be superior to a material forming a second electrode layer, which is placed in an upper layer part of the first electrode layer, in electrical transfer characteristics.

At least two electrode layers of the plurality of electrode layers may be respectively formed of different materials.

An interlayer oxide film, a silicon nitride film, and a tunnel oxide film may be disposed between the channel layer and each of the plurality of electrode layers.

A three dimensional flash memory according to another embodiment of the present invention may include: a channel layer; a plurality of electrode layers connected with the channel layer and stacked vertically; and a plurality of interlayer insulation layers connected with the channel layer, disposed alternately with the plurality of electrode layers, and stacked vertically, wherein the plurality of interlayer insulation layers may have different physical structures or different materials.

A material forming a first interlayer insulation layer of the plurality of interlayer insulation layers may be stronger than a material forming a second interlayer insulation layer, which is placed in an upper layer part of the first interlayer insulation layer, in a stress.

At least two interlayer insulation layers of the plurality of interlayer insulation layers may be respectively formed of different materials.

A first interlayer insulation layer of the plurality of interlayer insulation layers may be thicker than a second interlayer insulation layer, which is placed in an upper layer part of the first interlayer insulation layer, in a thickness.

[Respective lengths or surface patterns of the plurality of interlayer insulation layers may be different each other.

An interlayer oxide film, a silicon nitride film, and a tunnel oxide film may be disposed between the channel layer and each of the plurality of electrode layers.

A three dimensional flash memory according to still another embodiment of the present invention may include: a channel layer; a plurality of electrode layers connected with the channel layer and stacked vertically; and a plurality of interlayer insulation layers connected with the channel layer, disposed alternately with the plurality of electrode layers, and stacked vertically, wherein the plurality of interlayer insulation layer may have different physical structures or different materials, and wherein the plurality of electrode layer may have different physical structures or different materials.

Advantageous Effects of the Invention

Embodiments of the present invention may provide a three dimensional flash memory with an improved threshold voltage distribution of a plurality of electrode layers by differentiating the plurality of electrode layers in physical structures or materials, and a preparation method thereof. Accordingly, it may be allowable to improve credibility of data stored in the three dimensional flash memory.

Embodiments of the present invention may also provide a three dimensional flash memory with a uniform stress level of interlayer insulation layers by differentiating the interlayer insulation layers, as well as a plurality of electrode layers, in physical structures or materials, and a preparation method thereof.

BEST MODE

Hereafter, embodiments of the present invention will be described in detail with reference to the accompanied figures, but may not be construed to restrict the inventive concept of the present invention. Like reference numerals denote like elements throughout the accompanied figures.

Figure 1:
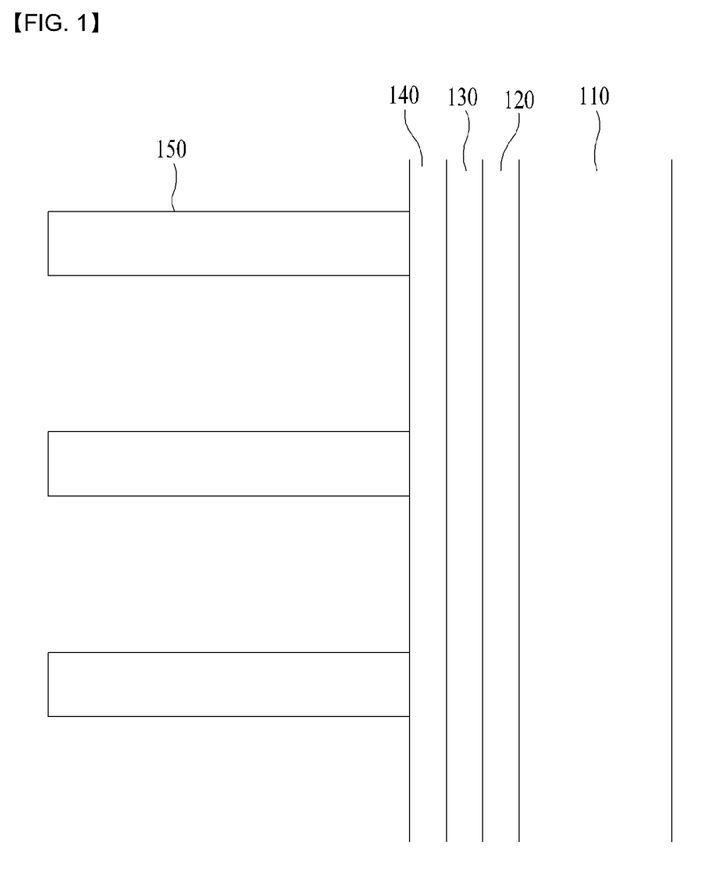
FIG. 1 is a sectional diagram generally illustrating a three dimensional flash memory.

FIG. 1 is a sectional diagram generally illustrating a three dimensional flash memory.

Referring to FIG. 1, a three dimensional memory may include a channel layer 110 as a vertically structured element. The channel layer 110 may be built vertically against a substrate (not illustrated). The channel layer may be made of single crystalline silicon. For example, the channel layer may be formed through a process of phase changeable epitaxial growth or selective epitaxial growth using a substrate as a seed.

A tunnel oxide film 120, a silicon nitride film 130, and an interlayer oxide film 140 may be formed around the channel layer 110. A plurality of electrode layers 150 may be stacked in a vertical form. Although not illustrated in FIG. 1, a plurality of interlayer insulation layers may be alternately disposed between the pluralities of electrode layers 150.

As described below, the tunnel oxide film 120, the silicon nitride film 130, and the interlayer oxide film 140 formed around the channel layer 110 may trap and store charges. Diffusion of charges due to an internal or external stress, which occurs during the charge trapping procedure, or along a lapse of time would cause data disturbance. During this, such an internal or external stress occurring during the charge trapping procedure may differently affect a plurality of interlayer insulation layers. For example, an interlayer insulation layer placed in an upper layer part may be stressed in a lower level, whereas an interlayer insulation layer placed in a lower layer part may be stressed in a higher level.

Additionally, since resistivity of the channel layer 110 is different by locations in a three dimensional flash memory, differences between respective threshold voltages of the plurality of electrode layers 150 cause a threshold voltage distribution to be broadened. The broadening of threshold voltage distribution would degrade the credibility of maintaining and reading data which are stored in the memory. Respective threshold voltages of the plurality of electrode layers 150 may be different because currents flowing through the plurality of electrode layers 150 are different in current density. For example, an electrode layer placed in an upper layer part may have higher current density, whereas an electrode layer placed in a lower layer part may have relatively row current density.

Figure 2:
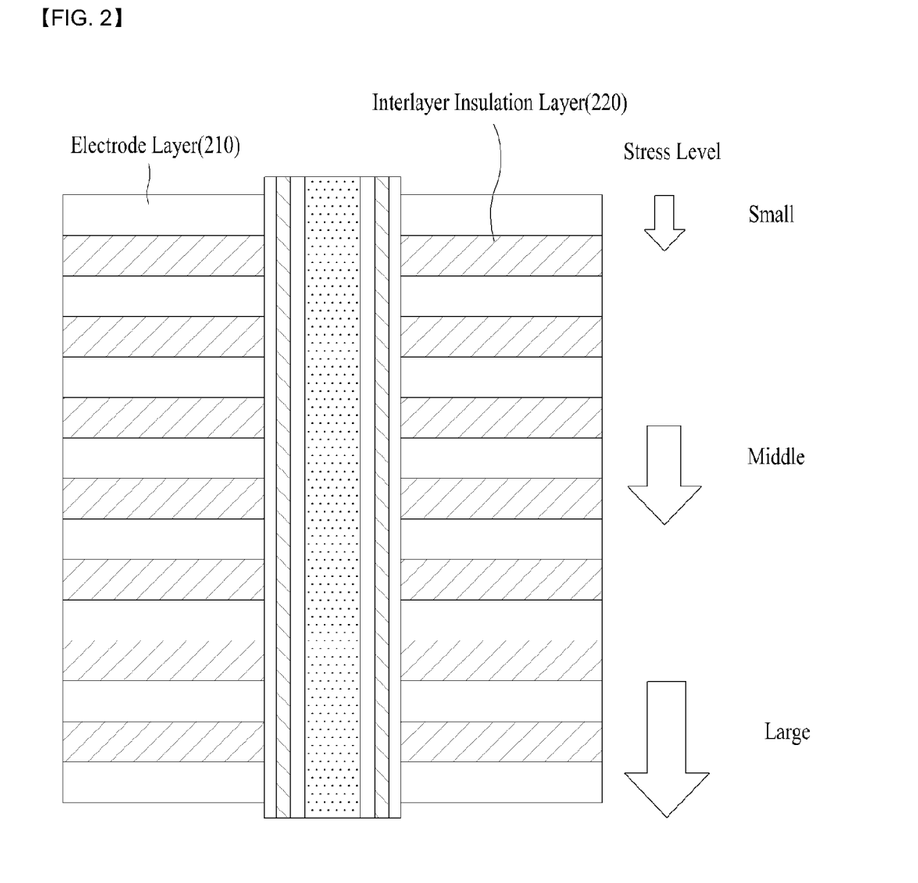
FIG. 2 is a sectional diagram illustrating a three dimensional flash memory including a plurality of interlayer insulation layers with the same material in a uniform physical structure.

FIG. 2 is a sectional diagram illustrating a three dimensional flash memory including a plurality of interlayer insulation layers with the same material in a uniform physical structure.

Referring to FIG. 2, due to the structural property of a three dimensional flash memory, an interlayer insulation layer of an upper layer part of a plurality of interlayer insulation layers 220 alternately disposed with a plurality of electrode layers 210 is stressed in a lower level while an interlayer insulation layer of a lower layer part is stressed in a higher level.

As such, stress levels differently applied to the plurality of interlayer insulation layers 220 may cause the credibility of data, which are stored in the memory, to be degraded. For that reason, embodiments of the present invention provide materials or physical structures of the plurality of interlayer insulation layers 220 to apply a substantially uniform stress level against the plurality of interlayer insulation layers 220.

Figure 3:
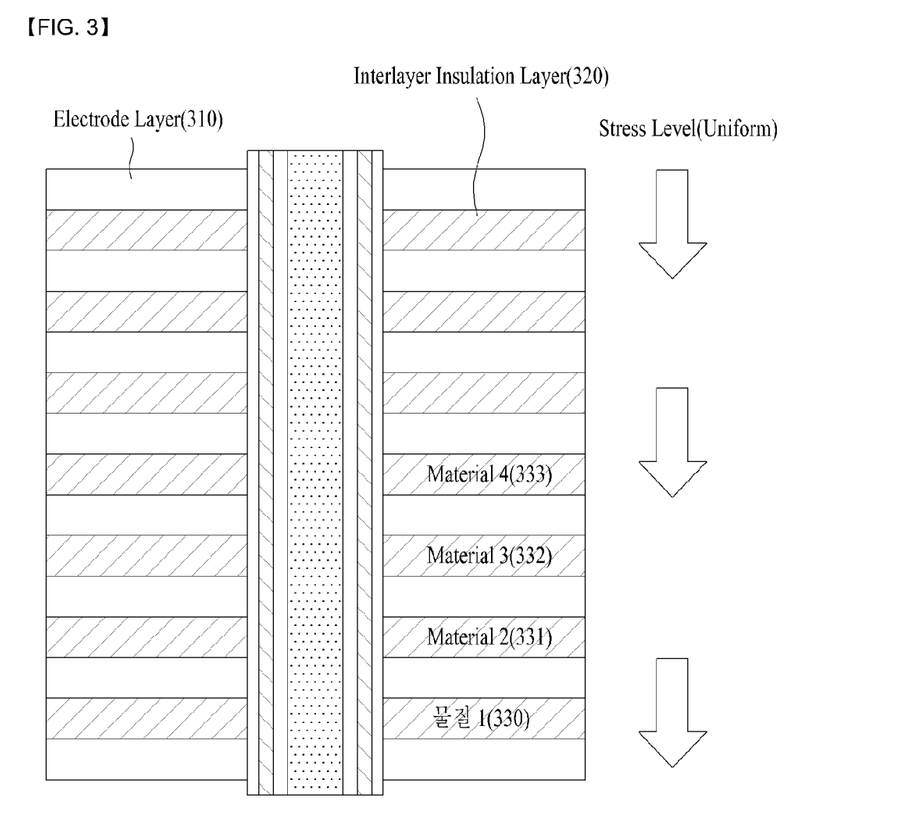
FIG. 3 is a sectional diagram illustrating a three dimensional flash memory including a plurality of interlayer insulation layers with different materials in a uniform physical structure in accordance with an embodiment of the present invention.

FIG. 3 is a sectional diagram illustrating a three dimensional flash memory including a plurality of interlayer insulation layers with different materials in a uniform physical structure in accordance with an embodiment of the present invention.

Referring to FIG. 3, in this embodiment of the present invention, a plurality of interlayer insulation layers 320 disposed respectively between pluralities of electrode layers 310 may be formed using different materials each other. For example, the plurality of interlayer insulation layers 320 may include an interlayer insulation layer 330 of Material 1, an interlayer insulation layer 331 of Material 2, an interlayer insulation layer 332 of Material 3, and an interlayer insulation layer 333 of Material 4.

The plurality of interlayer insulation layers 320 may be used for planarization or insulation, and may contain a gaseous material such as SiO2, DSG (SiOF), TFOS, or BPSG which forms a film through CVD, and a coating material (SOD) which is typically represented by Spin-On-Glass (SOG)/shiroki acid. These various materials may have their material properties with diversity for mechanical strength, dielectric constant, dielectric loss, chemical stability, thermal stability, conductivity, and so on, and such properties may define structural endurance against an internal or external stress.

In an embodiment of the present invention, it may be permissible to adopt a material, which is relatively weak against a stress, for an interlayer insulation layer placed in an upper layer part of the plurality of interlayer insulation layers 320, but to adopt a material, which is relatively strong against a stress, for an interlayer insulation layer placed in a lower layer part thereof. As a result, it may be accomplishable to uniform stress levels applied to the plurality of interlayer insulation layers 320.

Figure 4:
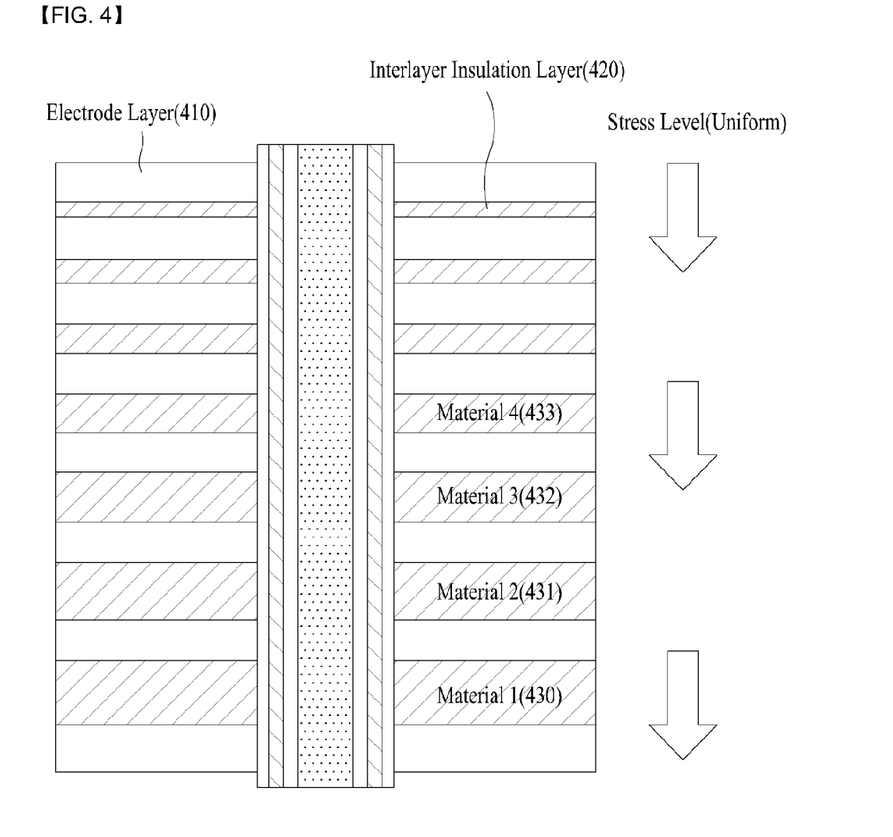
FIG. 4 is a sectional diagram illustrating a three dimensional flash memory including a plurality of interlayer insulation layers with different materials in different physical structures in accordance with an embodiment of the present invention.

FIG. 4 is a sectional diagram illustrating a three dimensional flash memory including a plurality of interlayer insulation layers with different materials in different physical structures in accordance with an embodiment of the present invention.

Referring to FIG. 4, in this embodiment of the present invention, it may be allowable to respectively design a plurality of interlayer insulation layers in different physical structures, even while using different materials respectively for the interlayer insulation layers as illustrated in FIG. 3. The physical structures may be decided by respective thicknesses or lengths of the plurality of interlayer insulation layers. In this configuration, the plurality of interlayer insulation layers may include a highest interlayer insulation layer, a lowest interlayer insulation layer, and middle interlayer insulation layers. Accordingly, designing the plurality of interlayer insulation layers respectively in different physical structures may hereafter mean designing a plurality of middle interlayer insulation layers respectively in different physical structures.

Further referring to FIG. 4, in this embodiment of the present invention, a plurality of interlayer insulation layers 420 disposed respectively between pluralities of electrode layers 410 may include an interlayer insulation layer 430 of Material 1, an interlayer insulation layer 431 of Material 2, an interlayer insulation layer 432 of Material 3, and an interlayer insulation layer 433 of Material 4. In this configuration, the interlayer insulation layer 430 of Material 1, the interlayer insulation layer 431 of Material 2, the interlayer insulation layer 432 of Material 3, and the interlayer insulation layer 433 of Material 4 may be arranged respectively in different thicknesses. For example, the interlayer insulation layer 430 of Material 1 may be thicker than the interlayer insulation layer 431 of Material 2, the interlayer insulation layer 432 of Material 3, and the interlayer insulation layer 433 of Material 4 in a thickness, which may uniform stress levels against the plurality of interlayer insulation layers.

Although the embodiment illustrated in FIG. 4 is described about a modification of physical structure through variation in respective thicknesses of the plurality of interlayer insulation layers 420, embodiments of the present invention may include various modifications with respective lengths and surface patterns of the plurality of interlayer insulation layers 420.

As such, although this embodiment of the present invention provides a plurality of interlayer insulation layers 420 having different physical structures, as well as being formed of different materials each other, embodiments of the present invention may not be restrictive hereto and may also propose a plurality of interlayer insulation layers 420 with the same material only in different physical structures.

Figure 5:
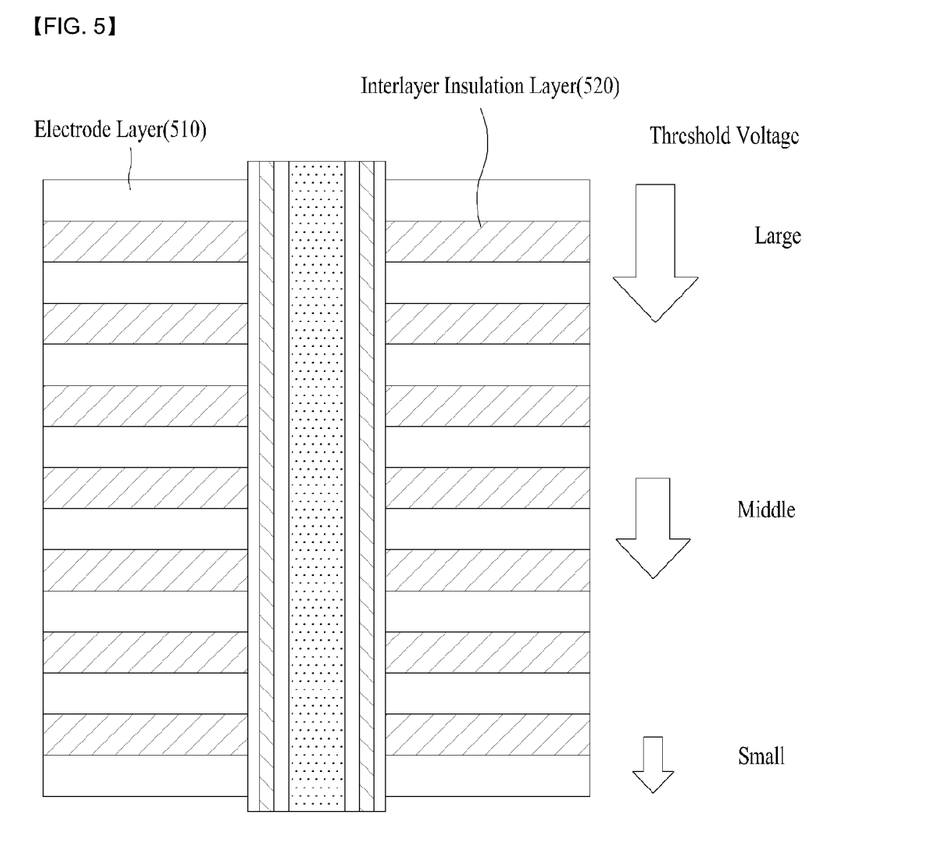
FIG. 5 is a sectional diagram illustrating a three dimensional flash memory including a plurality of electrode layers with the same material in the same physical structure.

FIG. 5 is a sectional diagram illustrating a three dimensional flash memory including a plurality of electrode layers with the same material in the same physical structure.

Referring to FIG. 5, due to the structural property of a three dimensional flash memory (e.g., the property that resistivity of a channel layer included in a three dimensional flash memory varies depending on a location thereof), an electrode layer of an upper layer part of a plurality of electrode layers 510 is different from an electrode layer of a lower layer part in current density of them. Because of that, there would be differences between respective threshold voltages of the plurality of electrode layers 510.

As such, the differences between respective threshold voltages of the plurality of electrode layers 510 may cause a threshold voltage distribution to be broadened, and the broadening of the threshold voltage distribution may cause degradation of credibility in maintaining and reading data which are stored in the memory. For that reason, embodiments of the present invention provide materials or physical structures for plurality of electrode layers 510 respectively to allow the plurality of electrode layers 510 to substantially have a uniform threshold voltage. During this, a plurality of interlayer insulation layers 520 alternately disposed with the plurality of electrode layers 510, as described above, may even have a material or physical structure which is substantially applicable for a uniform stress level.

Figure 6:
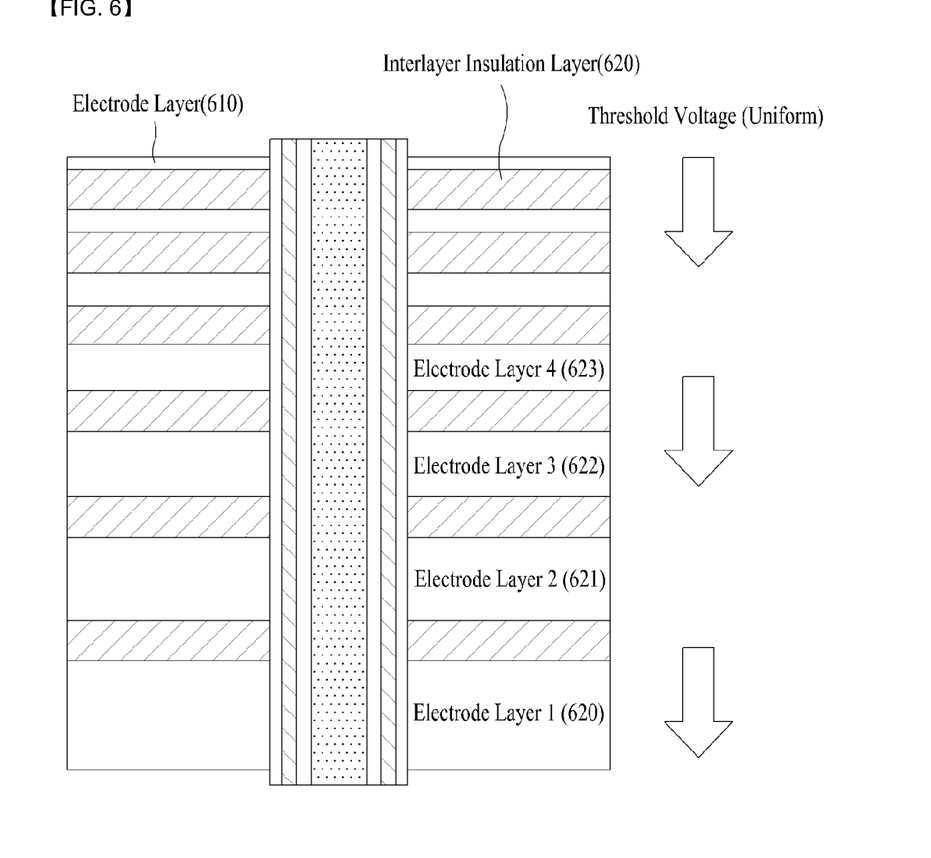
FIG. 6 is a sectional diagram illustrating a three dimensional flash memory including a plurality of electrode layers with the same material in different physical structures in accordance with an embodiment of the present invention.

FIG. 6 is a sectional diagram illustrating a three dimensional flash memory including a plurality of electrode layers with the same material in different physical structures in accordance with an embodiment of the present invention.

Referring to FIG. 6, in this embodiment of the present invention, a plurality of electrode layers 610 may be designed with different physical structures. For this configuration, the physical structures may be decided by respective thicknesses or lengths of the plurality of electrode layers 610. The plurality of electrode layers 610 may include a highest electrode layer, a lowest electrode layer, and middle electrode layers. Accordingly, designing the plurality of electrode layers 610 in different physical structures may hereafter mean designing a plurality of middle electrode layers in different physical structures.

For example, the plurality of electrode layers 610 may include Electrode layer 1 (620), Electrode layer 2 (621), Electrode layer 3 (622), and Electrode layer 4 (623). In this configuration, Electrode layer 1 (620) may be thicker than Electrode layer 2 (621), Electrode layer 3 (622), and Electrode layer 4 (623) in a thickness, which may uniform respective threshold voltages of the plurality of electrode layers 610.

Although the embodiment illustrated in FIG. 6 is described about a modification of physical structure through variation in respective thicknesses of the plurality of electrode layers 610, embodiments of the present invention may include various modifications with respective lengths and surface patterns of the plurality of electrode layers 610.

During this, a plurality of interlayer insulation layers 630 alternately disposed with the plurality of electrode layers 610, as described above, may even have a material or physical structure which is substantially applicable for a uniform stress level.

Figure 7:
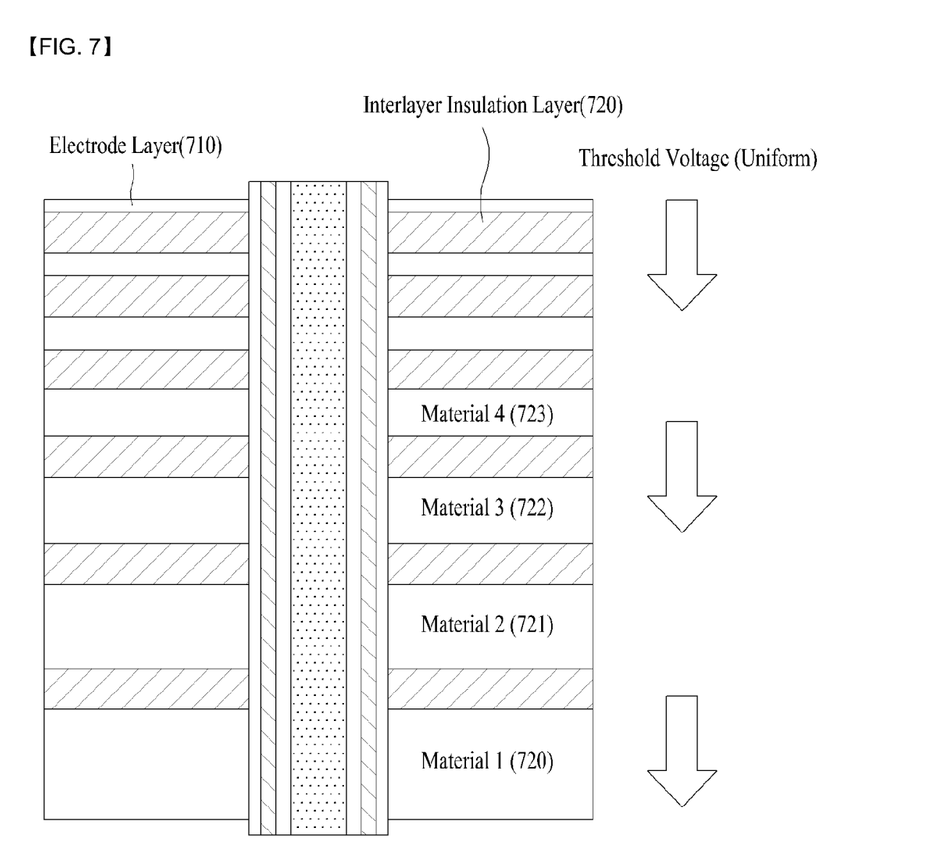
FIG. 7 is a sectional diagram illustrating a three dimensional flash memory including a plurality of electrode layers with different materials in different physical structures in accordance with an embodiment of the present invention.

FIG. 7 is a sectional diagram illustrating a three dimensional flash memory including a plurality of electrode layers with different materials in different physical structures in accordance with an embodiment of the present invention.

Referring to FIG. 7, in this embodiment of the present invention, as illustrated in FIG. 6, it may be allowable to use different materials for a plurality of electrode layers even while designing the plurality of electrode layers in different physical layers.

Further referring to FIG. 7, in this embodiment of the present invention, a plurality of electrode layers 710 may include an electrode layer 720 of Material 1, an electrode layer 721 of Material 2, an electrode layer 722 of Material 3, and an electrode layer 723 of Material 4.

In this configuration, according to this embodiment of the present invention, it may be allowable to adopt a material, which is relatively weak in electrical transfer characteristics, for an electrode layer placed in an upper layer part of the plurality of electrode layers 710, and to adopt a material, which is relatively strong in electrical transfer characteristics, for an electrode layer placed in a lower layer part thereof. For example, the electrode layer 720 of Material 1 may be superior to the electrode layer 723 of Material 4 in electrical transfer characteristics. Accordingly, the plurality of electrode layers 710 may be arranged with a uniform threshold voltage.

During this, a plurality of interlayer insulation layers 730 alternately disposed with the plurality of electrode layers 710, as described above, may even have a material or physical structure which is substantially applicable for a uniform stress level.

Additionally, although this embodiment of the present invention provides a plurality of electrode layers 710 having different physical structures, as well as being formed of different materials each other, embodiments of the present invention may not be restrictive hereto and may also propose a plurality of electrode layers 710 with different materials in a uniform physical structure.

Figure 8:
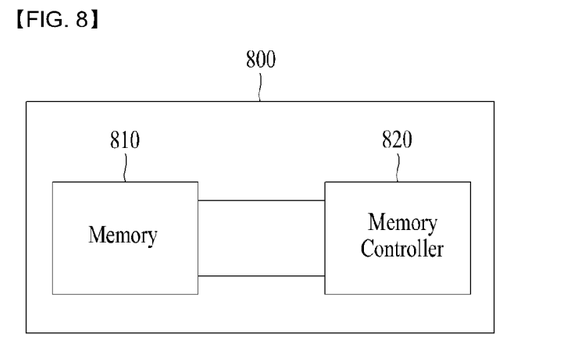
FIG. 8 is a diagram illustrating a storage device including a three dimensional flash memory according to an embodiment of the present invention.

FIG. 8 is a diagram illustrating a storage device including a three dimensional flash memory according to an embodiment of the present invention.

Referring to FIG. 8, a system 800 may be connected with a memory 810 and a memory controller 820. In this configuration, the memory 810 may mean a three dimensional flash memory which is described above. The memory 810 may be implemented even in a NOR flash memory, which is designed under the inventive concept of the present invention, a NAND flash memory as well.

The memory controller 820 may provide an input signal to control an operation of the memory 810.

The system 800, for example, may transfer an instruction from a host to control data, in relation with a memory and a memory controller which are used for a memory card, or may control various data of the memory on the basis of an applied control signal.

This structure may be applicable to many kinds of digital apparatuses, which employ memories, as well as to a simple memory card. This structure may be applicable to all of digital apparatuses requiring memories such as portable digital cameras or mobile phones.

Figure 9:
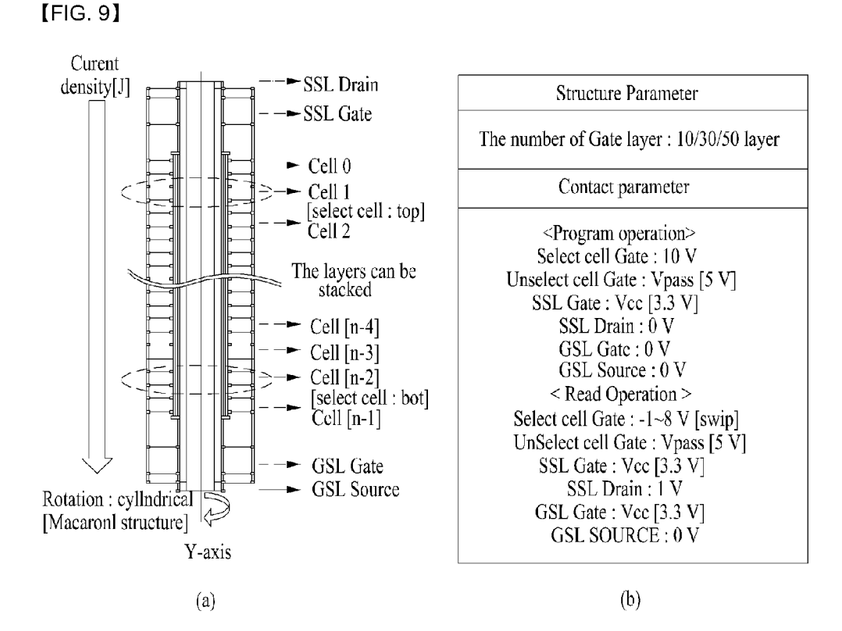
FIG. 9 illustrates a structure of a three dimensional flash memory including a plurality of electrode layers with the same material in a uniform physical structure.

FIG. 9 illustrates a structure of a three dimensional flash memory including a plurality of electrode layers with the same material in a uniform physical structure.

Referring to FIG. 9, there are illustrated the cases that a three dimensional flash memory is a NAND flash memory having a structure where cell transistors are serially connected to form a unit string and such unit strings are connected in parallel between a bit line and a ground line. Referring to (a) of FIG. 9, as a length of a string becomes longer, resistance of a channel layer increases to reduce current density toward a lower layer part of the string while a readout current applied to the bit line flows along the channel layer. Hereafter, FIG. 10 will be referred as an experimental result for drain currents by gate voltages when, as illustrated in (b) of FIG. 9, a reading operation is progressing to read stored data by applying a program bias voltage of 10 V respectively to top and bottom cells while changing the number of stacked cells of a unit string into 10, 30, and 50.

Figure 10:
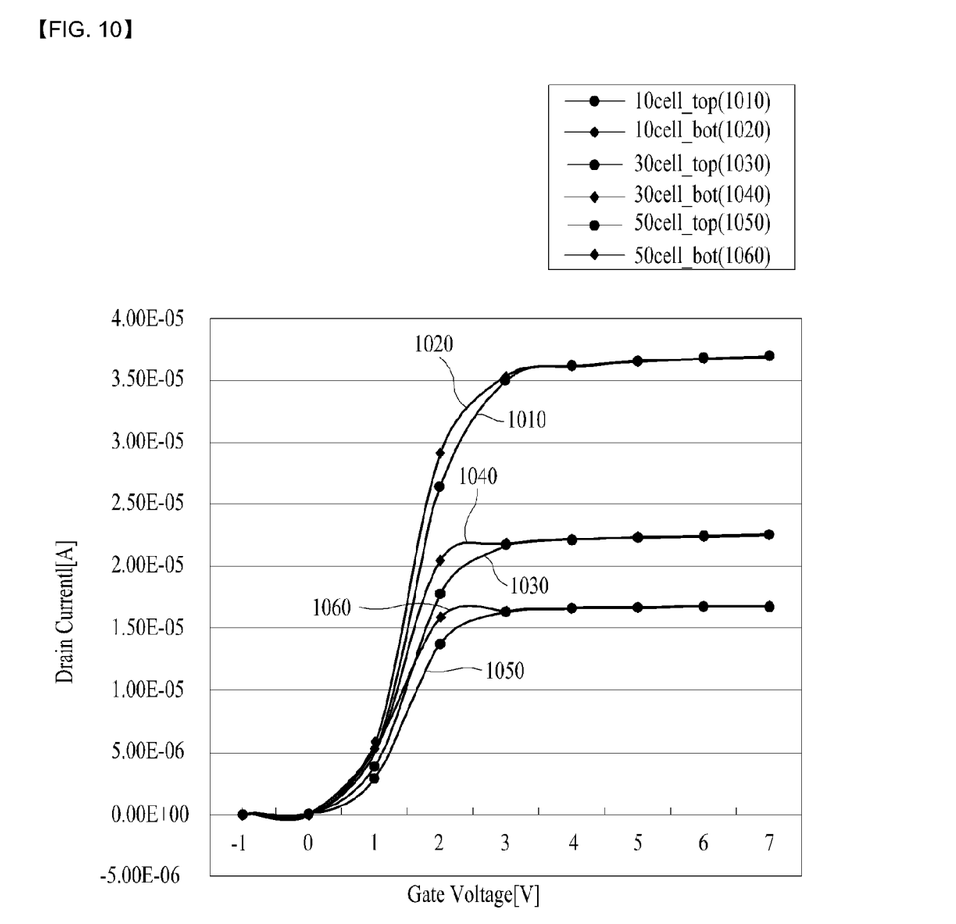
FIG. 10 is a graphic diagram showing threshold voltage distributions in the three dimensional flash memory illustrated in FIG. 9.

FIG. 10 is a graphic diagram showing threshold voltage distributions in the three dimensional flash memory of FIG. 9.

Referring to FIG. 10, it can be seen that drain currents 1030 and 1040 of top and bottom cells in the case that the number of stacked cells is 30 are smaller than drain currents 1010 and 1020 of top and bottom cells in the case that the number of stacked cells is 10, and drain currents 1050 and 1060 of top and bottom cells in the case that the number of stacked cells is 50 are smaller than the drain currents 1030 and 1040 of the top and bottom cells in the case that the number of stacked cells is 30.

Additionally, gate voltage gaps depending on the numbers of stacked cells in a unit string were measured as shown in Table 1.

TABLE 1

| | 10-stacked cells | | 30-stacked cells | | 50-stacked cells | |
|---|---|---|---|---|---|---|
| | top | bottom | top | bottom | Top | bottom |
| Saturation Drain Current [A] | 3.69E−05 | 3.69E−05 | 3.69E−05 | 3.69E−05 | 3.69E−05 | 3.69E−05 |
| Vt [V] | 0.7247 | 0.6549 | 0.6530 | 0.5080 | 0.4715 | 0.2633 |
| ΔVt [V] | 0.0698 | | 0.1450 | | 0.2082 | |

From Table 1, it can be seen that the threshold voltage gap between top and bottom cells increases as the number of stacked cells increases in a three dimensional flash memory. The threshold voltage gap ttis insignificant in the case that the number of stacked cells is small. But, if the number of stacked cells becomes larger, a threshold voltage distribution may be broadened in proportion thereto. This result degrades the credibility of reading data, especially, from a Multi-Level Cell (MLC) which stores 2 or more bits per cell.

Figure 11:
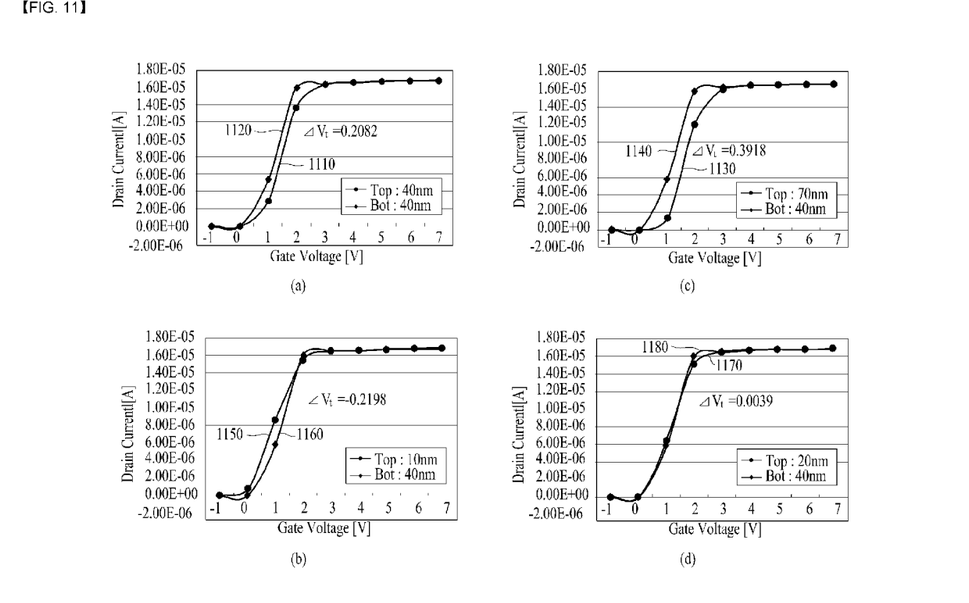
FIG. 11 shows graphic diagrams showing threshold voltage distributions of three dimensional flash memories in conformity with respective thicknesses of a plurality of electrode layers.

FIG. 11 shows graphic diagrams showing threshold voltage distributions of three dimensional flash memories in conformity with respective thicknesses of a plurality of electrode layers.

Referring to FIG. 11, threshold voltage distributions are compared in variation of thickness by adjusting respective thicknesses of a plurality of electrode layers which are gate layers of a three dimensional flash memory. As shown in (a) of FIG. 11, in the case of regulating respective thicknesses of the plurality of electrode layers on 40 nm, a gap of threshold voltages 1110 and 1120 between top and bottom electrode layers of the plurality of electrode layers is 0.2082.

Additionally, as shown in (b) of FIG. 11, in the case of setting a thickness of a top electrode layer of the plurality of electrode layers on 70 nm and setting a bottom electrode layer thereof on 40 nm, the thickness increasing upward, it can be seen that a gap of threshold voltages 1130 and 1140 between the top and bottom electrode layers is 0.3918.

Additionally, as shown in (c) of FIG. 11, in the case of setting a thickness of a top electrode layer of the plurality of electrode layers on 10 nm and setting a bottom electrode layer thereof on 40 nm, the thickness decreasing upward, it can be seen that a gap of threshold voltages 1150 and 1160 between the top and bottom electrode layers is −0.2198.

Additionally, as shown in (d) of FIG. 11, in the case of setting a thickness of a top electrode layer of the plurality of electrode layers on 20 nm and setting a bottom electrode layer thereof on 40 nm, the thickness decreasing upward, it can be seen that a gap of threshold voltages 1170 and 1180 between the top and bottom electrode layers is 0.0039.

Summarily, it can be seen that setting respective thicknesses of a plurality of electrode layers thicker downward may improve a threshold voltage distribution. Accordingly, it may be accomplishable to improve a threshold voltage distribution of a plurality of electrode layers by designing the plurality of electrode layers in different physical structures such that a first electrode layer of the plurality of electrode layers is thicker than a second electrode layer which is placed in an upper layer part of the first electrode layer.

INDUSTRIAL APPLICABILITY

While embodiments of the present invention have been shown and described with reference to the accompanying drawings thereof, it will be understood by those skilled in the art that various changes and modifications in form and details may be made therein without departing from the spirit and scope of the present invention as defined by the appended claims and their equivalents. For example, it may be allowable to achieve desired results although the embodiments of the present invention are performed in other sequences different from the descriptions, and/or the elements, such as system, structure, device, circuit, and so on, are combined or assembled in other ways different from the descriptions, replaced or substituted with other elements or their equivalents.

Therefore, other implementations, other embodiments, and equivalents of the appended claims may be included in the scope of the appended claims.

The invention claimed is:

1. A three dimensional flash memory comprising:
a channel layer;
a plurality of electrode layers connected with the channel layer and stacked vertically; and
a plurality of interlayer insulation layers connected with the channel layer, disposed alternately with the plurality of electrode layers, and stacked vertically,
wherein the plurality of electrode layers have different physical structures or different materials, and
wherein (i) at least two electrode layers of the plurality of electrode layers are respectively formed of different materials; and/or (ii) an interlayer oxide film, a silicon nitride film, and a tunnel oxide film are disposed between the channel layer and each of the plurality of electrode layers.

2. The three dimensional flash memory of claim 1, wherein a first electrode layer of the plurality of electrode layers is thicker than a second electrode layer, the second layer placed above the first layer in the vertically stacked layers.

3. The three dimensional flash memory of claim 1, wherein respective lengths or surface patterns of the plurality of electrode layers are different each other.

4. The three dimensional flash memory of claim 1, wherein at least two electrode layers of the plurality of electrode layers are respectively formed of different materials.

5. The three dimensional flash memory of claim 1, wherein an interlayer oxide film, a silicon nitride film, and a tunnel oxide film are disposed between the channel layer and each of the plurality of electrode layers.

6. A three dimensional flash memory comprising:
a channel layer;
a plurality of electrode layers connected with the channel layer and stacked vertically; and
a plurality of interlayer insulation layers connected with the channel layer, disposed alternately with the plurality of electrode layers, and stacked vertically,
wherein the plurality of interlayer insulation layers have different physical structures or different materials, and
wherein (i) a material forming a first interlayer insulation layer of the plurality of interlayer insulation layers is stronger than a material forming a second interlayer insulation layer, which is placed in an upper layer part of the first interlayer insulation layer, in a stress; and/or (ii) at least two interlayer insulation layers of the plurality of interlayer insulation layers are respectively formed of different materials; and/or (iii) a first interlayer insulation layer of the plurality of interlayer insulation layers is thicker than a second interlayer insulation layer, which is placed in an upper layer part of the first interlayer insulation layer, in a thickness; and/or (iv) an interlayer oxide film, a silicon nitride film, and a tunnel oxide film are disposed between the channel layer and each of the plurality of electrode layers.

7. The three dimensional flash memory of claim 6, wherein a material forming a first interlayer insulation layer of the plurality of interlayer insulation layers is stronger than a material forming a second interlayer insulation layer, which is placed in an upper layer part of the first interlayer insulation layer, in a stress.

8. The three dimensional flash memory of claim 6, wherein at least two interlayer insulation layers of the plurality of interlayer insulation layers are respectively formed of different materials.

9. The three dimensional flash memory of claim 6, wherein a first interlayer insulation layer of the plurality of interlayer insulation layers is thicker than a second interlayer insulation layer, which is placed in an upper layer part of the first interlayer insulation layer, in a thickness.

10. The three dimensional flash memory of claim 6, wherein respective lengths or surface patterns of the plurality of interlayer insulation layers are different each other.

11. The three dimensional flash memory of claim 6, wherein an interlayer oxide film, a silicon nitride film, and a tunnel oxide film are disposed between the channel layer and each of the plurality of electrode layers.

12. A three dimensional flash memory comprising:
a channel layer;
a plurality of electrode layers connected with the channel layer and stacked vertically; and
a plurality of interlayer insulation layers connected with the channel layer, disposed alternately with the plurality of electrode layers, and stacked vertically,
wherein the plurality of interlayer insulation layer has different physical structures or different materials, and
wherein the plurality of electrode layers have different physical structures or different materials, and
wherein (i) at least two electrode layers of the plurality of electrode layers are respectively formed of different materials; and/or (ii) an interlayer oxide film, a silicon nitride film, and a tunnel oxide film are disposed between the channel layer and each of the plurality of electrode layers; and/or (iii) a material forming a first interlayer insulation layer of the plurality of interlayer insulation layers is stronger than a material forming a second interlayer insulation layer, which is placed in an upper layer part of the first interlayer insulation layer, in a stress; and/or (iv) at least two interlayer insulation layers of the plurality of interlayer insulation layers are respectively formed of different materials; and/or (v) a first interlayer insulation layer of the plurality of interlayer insulation layers is thicker than a second interlayer insulation layer, which is placed in an upper layer part of the first interlayer insulation layer, in a thickness.

* * * * *